(12) United States Patent
Tahara et al.

(10) Patent No.: US 12,386,257 B2
(45) Date of Patent: Aug. 12, 2025

(54) PHOTOSENSITIVE RESIN COMPOSITION, METHOD OF MANUFACTURING PATTERN CURED FILM, CURED FILM, INTERLAYER INSULATING FILM, COVER COAT LAYER, SURFACE PROTECTIVE FILM, AND ELECTRONIC COMPONENT

(71) Applicant: HD Microsystems, Ltd., Tokyo (JP)

(72) Inventors: Shingo Tahara, Hitachi (JP); Nobuyuki Saito, Hitachi (JP); Daisaku Matsukawa, Hitachi (JP); Tetsuya Enomoto, Tokyo (JP)

(73) Assignee: HD Microsystems, Ltd., Tokyo (JP)

( * ) Notice: Subject to any disclaimer, the term of this patent is extended or adjusted under 35 U.S.C. 154(b) by 624 days.

(21) Appl. No.: 17/634,755

(22) PCT Filed: Aug. 12, 2020

(86) PCT No.: PCT/JP2020/030664
§ 371 (c)(1),
(2) Date: Feb. 11, 2022

(87) PCT Pub. No.: WO2021/029419
PCT Pub. Date: Feb. 18, 2021

(65) Prior Publication Data
US 2022/0276555 A1 Sep. 1, 2022

(30) Foreign Application Priority Data

Aug. 13, 2019 (WO) .................. PCT/JP2019/031889

(51) Int. Cl.
*G03F 7/031* (2006.01)
*C09D 179/08* (2006.01)
(Continued)

(52) U.S. Cl.
CPC ......... *G03F 7/031* (2013.01); *C09D 179/085* (2013.01); *G03F 7/004* (2013.01);
(Continued)

(58) Field of Classification Search
None
See application file for complete search history.

(56) References Cited

U.S. PATENT DOCUMENTS

2017/0309844 A1* 10/2017 Saeki ................... H10K 50/865
2018/0215874 A1*  8/2018 Kawabata ................ G03F 7/20
2018/0373147 A1* 12/2018 Yorisue ................ G03F 7/0388

FOREIGN PATENT DOCUMENTS

| CN | 101566799 A | 10/2009 |
| JP | 2009-265520 A | 11/2009 |

(Continued)

*Primary Examiner* — Mark F. Huff
*Assistant Examiner* — Kevin J Drummey
(74) *Attorney, Agent, or Firm* — FITCH, EVEN, TABIN & FLANNERY, LLP

(57) ABSTRACT

A photosensitive resin composition of the invention contains (A) a polyimide precursor having a polymerizable unsaturated bond, (B) a photopolymerization initiator comprising a compound represented by the formula (11), (C) a thermal radical generator, and (D) a solvent containing γ-butyrolactone:

(11)

(Continued)

wherein in the formula (11), $R^{11}$ is a substituted or unsubstituted benzoyl group, a substituted or unsubstituted fluorenyl group, or a group comprising a substituted or unsubstituted carbazolyl group; $R^{12}$ is an alkyl group including 1 to 12 carbon atoms, a group comprising a cycloalkyl group including 4 to 10 carbon atoms, a group comprising a phenyl group, or a group comprising a tolyl group; $R^{13}$ is a substituted or unsubstituted aromatic hydrocarbon group including 6 to 20 carbon atoms.

15 Claims, 1 Drawing Sheet

(51) Int. Cl.
    *G03F 7/004*         (2006.01)
    *G03F 7/038*         (2006.01)
    *G03F 7/40*          (2006.01)

(52) U.S. Cl.
    CPC .......... *G03F 7/0387* (2013.01); *G03F 7/0388* (2013.01); *G03F 7/40* (2013.01)

(56) References Cited

FOREIGN PATENT DOCUMENTS

| | | |
|---|---|---|
| JP | 2014-145947 A | 8/2014 |
| JP | 2014-201696 A | 10/2014 |
| JP | 2018-84626 A | 5/2018 |
| KR | 20120023545 | 3/2012 |
| WO | 2016/194769 A1 | 12/2016 |
| WO | 2017/002859 A1 | 1/2017 |
| WO | 2017/038664 A1 | 3/2017 |
| WO | 2017/043474 A1 | 3/2017 |
| WO | 2017/104672 A1 | 6/2017 |
| WO | WO-2019044874 A1 * 3/2019 ............. C08G 73/12 |

\* cited by examiner

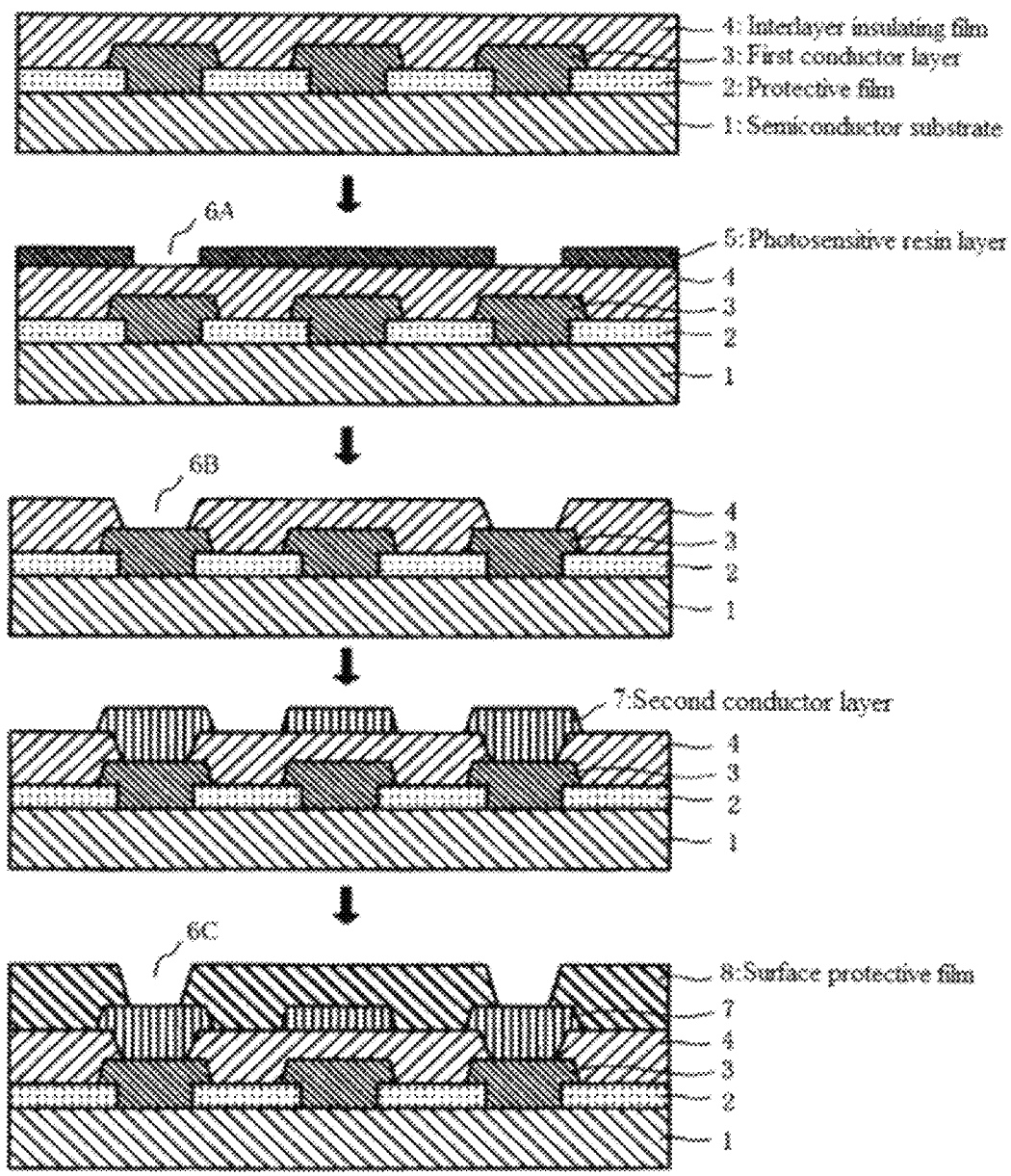

PHOTOSENSITIVE RESIN COMPOSITION, METHOD OF MANUFACTURING PATTERN CURED FILM, CURED FILM, INTERLAYER INSULATING FILM, COVER COAT LAYER, SURFACE PROTECTIVE FILM, AND ELECTRONIC COMPONENT

CROSS-REFERENCE TO RELATED APPLICATIONS

This application is a U.S. national phase application filed under 35 U.S.C. § 371 of International Application No. PCT/JP2020/030664, filed Aug. 12, 2020, which claims priority from International Application No. PCT/JP2019/031889, filed Aug. 13, 2019, which are both incorporated herein by reference in their entireties.

TECHNICAL FIELD

The invention relates to a photosensitive resin composition, a method for manufacturing a pattern cured film, a cured film, an interlayer insulating film, a cover coat layer, a surface protective film, and an electronic component.

BACKGROUND ART

Polyimide having excellent heat resistance, electrical characteristics, mechanical characteristics, and the like has been used for a surface protective film and an interlayer insulating film of a semiconductor device. In recent years, a photosensitive resin composition in which photosensitive characteristics are imparted to these resins itself has been used, and by using this photosensitive resin composition, the manufacturing process of a pattern cured film can be simplified, and a complicated manufacturing process can be shortened (for example, refer to Patent Document 1).

RELATED ART DOCUMENTS

Patent Documents

[Patent Document 1] JP 2009-265520 A
[Patent Document 2] JP 2014-201696 A
[Patent Document 3] JP 2014-145947 A
[Patent Document 4] JP 2018-84626 A
[Patent Document 5] WO 2017/2859 A1

SUMMARY OF THE INVENTION

As a solvent of a photosensitive resin composition, conventionally, N-methylpyrrolidone (hereinafter, sometimes referred to as "NMP") has been used, but in recent years, an NMP-free material has been sought from the viewpoint of harmfulness. Although the inventors have attempted to use γ-butyrolactone (hereinafter, sometimes referred to as' GBL") having low toxicity as an alternative solvent, a problem has emerged that a photosensitive resin composition using GBL has a large change in residual film ratio when stored for a long period of time, that is, a low storage stability. Patent Documents 2 to 5 disclose photosensitive resin compositions using GBL, but all of the compositions have low storage stability and are required to be improved.

It is an object of the invention to provide a photosensitive resin composition which has low toxicity and has a small change in the residual film ratio when stored for a long period of time, that is, excellent in storage stability. Further, it is an object of the invention to provide a method for manufacturing a pattern cured film using the photosensitive resin composition, a cured film of the photosensitive resin composition, an interlayer insulating film prepared using the cured film, and the like, and an electronic component containing the interlayer insulating film and the like.

As a result of extensive studies conducted by the inventors in view of the above problems, it has been found that, when a photopolymerization initiator having a specific structure is used, a change in the residual film ratio when stored for a long period of time is small even when GBL having low toxicity is used as a solvent, and excellent storage stability can be realized, thereby completing the invention.

According to the invention, the following photosensitive resin composition and the like are provided.

1. A photosensitive resin composition comprising: (A) a polyimide precursor having a polymerizable unsaturated bond;
   (B) a photopolymerization initiator comprising a compound represented by the following formula (11);
   (C) a thermal radical generator; and
   (D) a solvent containing γ-butyrolactone:

(11)

wherein in the formula (11), $R^{11}$ is a substituted or unsubstituted benzoyl group, a substituted or unsubstituted fluorenyl group, or a group comprising a substituted or unsubstituted carbazolyl group;
$R^{12}$ is an alkyl group including 1 to 12 carbon atoms, a group comprising a cycloalkyl group including 4 to 10 carbon atoms, a group comprising a phenyl group, or a group comprising a tolyl group;
$R^{13}$ is a substituted or unsubstituted aromatic hydrocarbon group including 6 to 20 carbon atoms.

2. The photosensitive resin composition according to 1, wherein the compound represented by the formula (11) is a compound represented by the following formula (12):

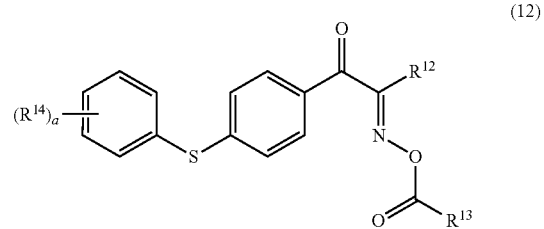

(12)

wherein in the formula (12), $R^{12}$ and $R^{13}$ are the same as in the formula (11); $R^{14}$ is a monovalent organic group; and a is an integer of 0 to 5.

3. The photosensitive resin composition according to 2, wherein a is 0.

4. The photosensitive resin composition according to any one of 1 to 3, wherein $R^{13}$ is a substituted or unsubstituted phenyl group.

5. The photosensitive resin composition according to any one of 1 to 4, wherein $R^{12}$ is an alkyl group including 1 to 12 carbon atoms, or a group comprising a cycloalkyl group including 4 to 10 carbon atoms.
6. The photosensitive resin composition according to any one of 1 to 5, wherein the component (C) comprises a compound having a decomposition point of 110° C. or higher and 200° C. or lower.
7. The photosensitive resin composition according to any one of 1 to 6, wherein the component (C) comprises bis(1-phenyl-1-methylethyl)peroxide.
8. The photosensitive resin composition according to any one of 1 to 7, wherein the component (A) is a polyimide precursor having a structural unit represented by the following formula (1):

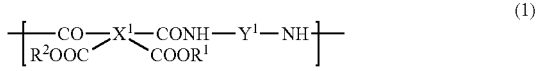
(1)

wherein in the formula (1), $X^1$ is a tetravalent aromatic group; $Y^1$ is a divalent aromatic group; $R^1$ and $R^2$ are independently a hydrogen atom, a group represented by the following formula (2), or an aliphatic hydrocarbon group including 1 to 4 carbon atoms; at least one of $R^1$ and $R^2$ is a group represented by the following formula (2); a —COOR$^1$ group and a —CONH— group are in ortho-position with each other; and a —COOR$^2$ group and a —CO-group are in ortho-position with each other;

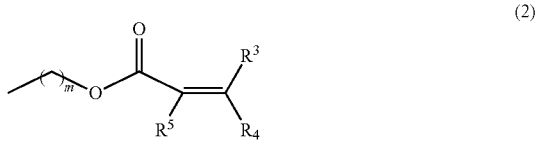
(2)

wherein in the formula (2), $R^3$ to $R^5$ are independently a hydrogen atom, or an aliphatic hydrocarbon group including 1 to 3 carbon atoms; and m is an integer of 1 to 10.
9. The photosensitive resin composition according to any one of 1 to 8, further comprising a polyfunctional polymerizable monomer having two or more functional groups.
10. A method of manufacturing a pattern cured film comprising:
   coating the photosensitive resin composition according to any one of 1 to 9 on a substrate, followed by drying to form a photosensitive resin film;
   pattern-exposing the photosensitive resin film to obtain a resin film;
   developing the resin film after the pattern exposure using an organic solvent to obtain a pattern resin film; and
   heat-treating the pattern resin film.
11. The method for manufacturing a pattern cured film according to 10, wherein a temperature of the heat treatment is 200° C. or lower.
12. A cured film obtained by curing the photosensitive resin composition according to any one of 1 to 9.
13. The cured film according to 12, which is a pattern cured film.
14. An interlayer insulating film, a cover coat layer, or a surface protective film manufactured by using the cured film according to 12 or 13.
15. An electronic component comprising the interlayer insulating film, the cover coat layer, or the surface protective film according to 14.

According to the invention, it is possible to provide a photosensitive resin composition which has low toxicity and excellent in storage stability.

BRIEF DESCRIPTION OF THE DRAWINGS

The FIGURE is a schematic diagram showing a manufacturing process of an electronic component according to one embodiment of the invention.

MODE FOR CARRYING OUT THE INVENTION

Hereinafter, embodiments of the photosensitive resin composition of the invention, a method of manufacturing a pattern cured film using the photosensitive resin composition, a cured film of the photosensitive resin composition, an interlayer insulating film prepared using the cured film, and the like, and an electronic component containing the interlayer insulating film and the like will be described in detail. Note that the invention is not limited by the following embodiments.

In the specification, "A or B" may include either or both of A and B. In this specification, the term "step" includes not only an independent step, but also a step if the intended action of the step is achieved even when the step is not clearly distinguishable from other steps. In this specification, a numerical value range represented by using "to" indicates a range including numerical values described before and after "to" as the minimum value and the maximum value, respectively. In this specification, when a plurality of materials corresponding to each component exist in a composition, unless otherwise specified, the content of each component in the composition herein means the total amount of the plurality of materials existing in the composition. In this specification, unless otherwise specified, materials listed as examples may be used alone or in combination of two or more. The term "(meth)acrylic group" in this specification means an "acrylic group" and a "methacrylic group", and "(meth)acrylate" represents "methacrylate" or "acrylate."

[Photosensitive Resin Composition]

A photosensitive resin composition of the invention contains (A) a polyimide precursor having a polymerizable unsaturated bond (hereinafter also referred to as a "component (A)"), (B) a photopolymerization initiator containing a compound represented by the formula (11) (hereinafter also referred to as a "component (B)"), (C) a thermal radical generator (hereinafter also referred to as a "component (C)"), and (D) a solvent containing γ-butyrolactone (hereinafter also referred to as a "component (D)"). The photosensitive resin composition of the invention is preferably a negative photosensitive resin composition.

(11)

In the formula (11), $R^{11}$ is a substituted or unsubstituted benzoyl group, a substituted or unsubstituted fluorenyl group, or a group containing a substituted or unsubstituted carbazolyl group;

$R^{12}$ is an alkyl group including 1 to 12 carbon atoms, a group containing a cycloalkyl group including 4 to 10 carbon atoms, a group containing a phenyl group, or a group containing a tolyl group;

$R^{13}$ is a substituted or unsubstituted aromatic hydrocarbon group including 6 to 20 carbon atoms.

By having the above configuration, the photosensitive resin composition of the invention is excellent in storage stability even though GBL is used as a solvent. The reason why such an effect is exhibited is not necessarily clear, but is presumed as follows. In other words, in the compound represented by the formula (11) in the component (B), the site represented by $R^{13}$ corresponds to a radical generation site, and it is considered that, since the solvation of the photopolymerization initiator is suppressed by adopting a structure which can be sterically hindered at the site, the generation of radicals at the time of light irradiation is not inhibited or the inhibition is reduced, and as a result, the storage stability is improved. Storage stability can be evaluated by the residual film ratio change described in Examples. In other words, the storage stability can be evaluated that the smaller the residual film ratio change, the better the storage stability.

Hereinafter, each component will be described.

(Component ((A): A Polyimide Precursor Having a Polymerizable Unsaturated Bond)

The component (A) is not particularly limited as long as it is a polyimide precursor having a polymerizable unsaturated bond, and a polyimide precursor having a high transmittance when an i-line is used for a light source at the time of patterning, and exhibiting high cured film characteristics even at a low temperature curing of 200° C. or lower is preferred.

Examples of the polymerizable unsaturated bond include a double-bond between carbon atoms and the like.

The component (A) is preferably a polyimide precursor having a structural unit represented by the following formula (1). By using such a polyimide precursor, a cured film having a high i-line transmittance and a satisfactory curing property can be formed even when cured at a low temperature of 200° C. or lower.

(1)

In the formula (1), $X^1$ is a tetravalent aromatic group; $Y^1$ is a divalent aromatic group; $R^1$ and $R^2$ are independently a hydrogen atom, a group represented by the following formula (2), or an aliphatic hydrocarbon group including 1 to 4 carbon atoms; at least one of $R^1$ and $R^2$ is a group represented by the following formula (2); a —COOR$^1$ group and a —CONH— group are in ortho-position with each other; and a —COOR$^2$ group and a —CO-group are in ortho-position with each other.

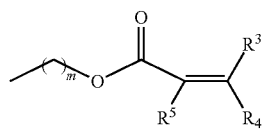

(2)

In the formula (2), $R^3$ to $R^5$ are independently a hydrogen atom, or an aliphatic hydrocarbon group including 1 to 3 carbon atoms; and m is an integer of 1 to 10, preferably an integer of 2 to 10, more preferably an integer of 2 to 5, and still more preferably 2 or 3.

The tetravalent aromatic group of $X^1$ of the formula (1) may be a tetravalent aromatic hydrocarbon group, for example, including 6 to 20 ring carbon atoms, and may be a tetravalent aromatic heterocyclic group, for example, including 5 to 20 ring atoms. $X^1$ is preferably a tetravalent aromatic hydrocarbon group.

Examples of the tetravalent aromatic hydrocarbon group of $X^1$ include, and are not limited to; the following groups.

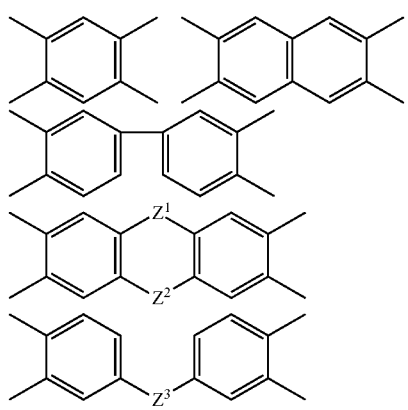

In the formula, $Z^1$ and $Z^2$ are independently a divalent group which is not conjugated to the benzene ring with which each is bonded, or a single bond; and $Z^3$ is an ether bond (—O—) or a sulfide bond (—S—).

The divalent group of $Z^1$ and $Z^2$ are preferably —O—, —S—, a methylene group, a bis(trifluoromethyl)methylene group, or a difluoromethylene group, and more preferably —O—.

$Z^3$ is preferably —O—.

The divalent aromatic group of $Y^1$ of the formula (1) may be a divalent aromatic hydrocarbon group, for example, including 6 to 20 ring carbon atoms, and may be a divalent aromatic heterocyclic group, for example, including 5 to 20 ring atoms. $Y^1$ is preferably a divalent aromatic hydrocarbon group.

Examples of the divalent aromatic hydrocarbon group of $Y^1$ include, and are not limited to, a group represented by the following formula (3).

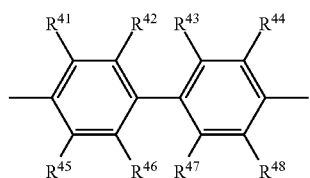

(3)

In the formula (3), $R^{41}$ to $R^{48}$ are independently a hydrogen atom, a monovalent aliphatic hydrocarbon group, or a monovalent organic group having a halogen atom.

The monovalent aliphatic hydrocarbon group of $R^{41}$ to $R^{48}$ (preferably including 1 to 10 carbon atoms, more preferably including 1 to 6 carbon atoms) is preferably a methyl group.

The monovalent organic group including a halogen atom (preferably a fluorine atom) of $R^{41}$ to $R^{48}$ is preferably a monovalent aliphatic hydrocarbon group having a halogen atom (preferably including 1 to 10 carbon atoms, more preferably including 1 to 6 carbon atoms), and preferably a trifluoromethyl group.

In the formula (3), for example, $R^{42}$ and $R^{43}$ may be monovalent aliphatic hydrocarbon groups (e.g., methyl groups), and $R^{41}$ and $R^{44}$ to $R^{48}$ may be hydrogen atoms.

As $Y^1$, a divalent group obtained by removing two hydrogen atoms from a diphenyl ether, or a divalent group obtained by removing two hydrogen atoms from a benzene can be used.

Examples of the aliphatic hydrocarbon group including 1 to 4 (preferably 1 or 2) carbon atoms of $R^1$ and $R^2$ of the formula (1) include a methyl group, an ethyl group, an n-propyl group, a 2-propyl group, an n-butyl group, and the like.

In the formula (1), at least one of $R^1$ and $R^2$ is a group represented by the formula (2), preferably both $R^1$ and $R^2$ are groups represented by the formula (2).

Examples of the aliphatic hydrocarbon group including 1 to 3 (preferably 1 or 2) carbon atoms of $R^3$ to $R^5$ of the formula (2) include a methyl group, an ethyl group, an n-propyl group, a 2-propyl group, and the like. A methyl group is preferable.

A polyimide precursor having a structural unit represented by the formula (1) can be produced, for example, by reacting a tetracarboxylic dianhydride represented by the following formula (4) with a diamino compound represented by the following formula (5) in an organic solvent such as N-methylpyrrolidone to produce a polyamic acid, adding a compound represented by the following formula (6), and reacting the mixture in an organic solvent to introduce an ester group entirely or partially.

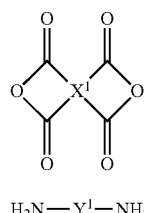

(4)

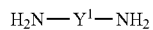

(5)

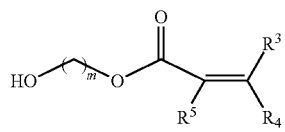

(6)

In the formula (4), $X^1$ is a group corresponding to $X^1$ of the formula (1). In the formula (5), $Y^1$ is as defined in the formula (1). In the formula (6), $R^3$ to $R^5$ and m are as defined in the formula (2).

A polyimide precursor having a structural unit represented by the formula (1) can also be produced, for example, by producing an ester compound by reaction of a tetracarboxylic dianhydride represented by the formula (4) with a compound represented by the formula (6), and then reacting the ester compound with a diamino compound represented by the formula (5).

The tetracarboxylic dianhydride represented by the formula (4) and the diamino compound represented by the formula (5) may be used alone or in combination of two or more.

The content of the structural unit represented by the formula (1) is preferably 50 mol % or more, more preferably 80 mol % or more, and still more preferably 90 mol % or more, all the structural units of the component (A). The upper limit is not particularly limited, and may be 100 mol %.

A component (A) may have a structural unit other than the structural unit represented by the formula (1). Examples of the structural unit other than the structural unit represented by the formula (1) include the structural unit represented by the following formula (7).

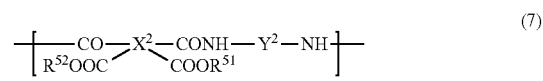

(7)

In the formula (7), $X^2$ is a tetravalent aromatic group; $Y^2$ is a divalent aromatic group; $R^{51}$ and $R^{52}$ are independently a hydrogen atom or a hydrocarbon group including 1 to 4 carbon atoms; a —COOR$^{51}$ group and a —CONH— group are in ortho-position with each other; and a —COOR$^{52}$ group and a —CO— group are in ortho-position with each other.

Examples of the tetravalent aromatic group of $X^2$ of the formula (7) include the same group as the tetravalent aromatic group of $X^1$ of the formula (1). Examples of the divalent aromatic group of $Y^2$ include the same group as the divalent aromatic group of $Y^1$ of the formula (1). Examples of the aliphatic hydrocarbon group including 1 to 4 carbon atoms of $R^{51}$ and $R^{52}$ include the same group as the aliphatic hydrocarbon group including 1 to 4 carbon atoms of $R^1$ and $R^2$ of the formula (1).

The content of the structural unit other than the structural unit represented by the formula (1) is preferably less than 50 mol % based on all the structural units of the component (A).

The structural unit other than the structural unit represented by the formula (1) may be used alone or in combination of two or more.

In the component (A), the proportion of the carboxy group esterified with the group represented by the formula (2) is preferably 50 mol % or more, more preferably 60 to 100 mol %, and still more preferably 70 to 90 mol %, based on the total carboxy group and the total carboxy ester in the polyimide precursor.

There is no particular limitation on the molecular weight of the component (A), and is preferably 10,000 to 200,000 in terms of number-average molecular weight.

The number-average molecular weight is determined by a gel permeation chromatography and obtained by conversion using a standard polystyrene calibration curve.

(Component (B): A Photopolymerization Initiator Containing a Compound Represented by the Formula (11))

A photopolymerization initiator contains a compound represented by the formula (11).

(11)

In the formula (11), $R^{11}$ is a substituted or unsubstituted benzoyl group, a substituted or unsubstituted fluorenyl group, or a group containing a substituted or unsubstituted carbazolyl group (e.g., a carbazolyl carbonyl group, a carbazolyl alkyl group (e.g., including 1 to 6, preferably 1 to 4 carbon atoms) (preferably a carbazolylmethyl group, or a carbazolyl ethyl group)).

$R^{12}$ is an alkyl group including 1 to 12 carbon atoms, a group containing a cycloalkyl group including 4 to 10 carbon atoms, a group containing a phenyl group, or a group containing a tolyl group.

$R^{13}$ is a substituted or unsubstituted aromatic hydrocarbon group including 6 to 20 carbon atoms.

$R^{11}$ is preferably a substituted or unsubstituted benzoyl group.

Examples of the substitution of a substituted or unsubstituted benzoyl group, a substituted or unsubstituted fluorenyl groups, or a group containing substituted or unsubstituted carbazolyl group of $R^{11}$ (hereinafter also referred to as an arbitrary substituent) include a phenylthio group, an ethyloloxy group, an alkyl group including 1 to 20 carbon atoms (e.g., a methyl group, an ethyl group, an n-propyl group), an alkoxy group including 1 to 20 (preferably 1 to 10, more preferably 1 to 8) carbon atoms which may be halogenated (preferably fluorinated), a 2,2-dimethyl-1,3-dioxolane-4-yl) methoxy group, a benzoyl group, a 2-(benzoyloxyimino ($C_6H_5$—C(=O)—N=)octanone-1-yl group, a 2-(benzoyloxyimino($C_6H_5$—C(=O)—N=)-3-cyclohexylpropanone-1-yl group, and the like.

The arbitrary substituent may further have any substituents described above.

$R^{12}$ is preferably an alkyl group including 1 to 12 carbon atoms or a group containing a cycloalkyl group including 4 to 10 carbon atoms, and more preferably an alkyl group including 1 to 8 carbon atoms or a cycloalkylmethyl group (the number of carbon atoms of the cycloalkyl moiety is 4 to 10).

$R^{13}$ is a substituted or unsubstituted aromatic hydrocarbon group including 6 to 20 carbon atoms, preferably a substituted or unsubstituted aromatic hydrocarbon group including 6 to 15 carbon atoms, and more preferably a substituted or unsubstituted phenyl group. Examples of the substituent include an alkyl group including 1 to 12 carbon atoms and the like.

The compound represented by the formula (11) is preferably a compound represented by the following formula (12).

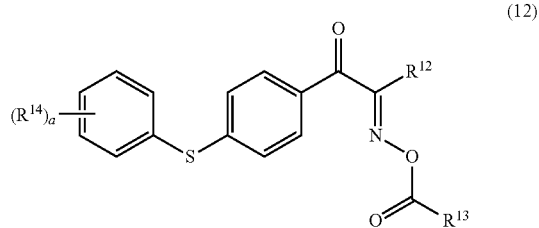

(12)

In the formula (12), $R^{12}$ and $R^{13}$ are the same as in the formula (11); $R^{14}$ is a monovalent organic group; and a is an integer of 0 to 5.

The organic group of $R^{14}$ is, for example, —OH, —COOH, —O(CH$_2$)OH, —O(CH$_2$)$_2$OH, —COO(CH$_2$)OH, or —COO(CH$_2$)$_2$OH, preferably —O(CH$_2$)OH, —O(CH$_2$)$_2$OH, —COO(CH$_2$)OH, or —COO(CH$_2$)$_2$OH, and more preferably —O(CH$_2$)$_2$OH, or —COO(CH$_2$)$_2$OH.

a is preferably 0.

As a component (B), the compounds represented by the formula (11) may be used alone, or in combination of two or more thereof.

As a component (B), a compound represented by the formula (11) and an other photopolymerization initiator other than the compound represented by the formula (11) may be used in combination.

Examples of the other photopolymerization initiator include, for example, a compound in which $R^{13}$ in the compound represented by the formula (11) or (12) is a group which is not a substituted or unsubstituted aromatic hydrocarbon group including 6 to 20 carbon atoms. Examples of the "group which is not a substituted or unsubstituted aromatic hydrocarbon group including 6 to 20 carbon atoms" include, and are not limited to, an alkyl group including 1 to 12 carbon atoms, and the like.

Further, examples of the other photopolymerization initiator include a compound represented by the following formula (15) and the like.

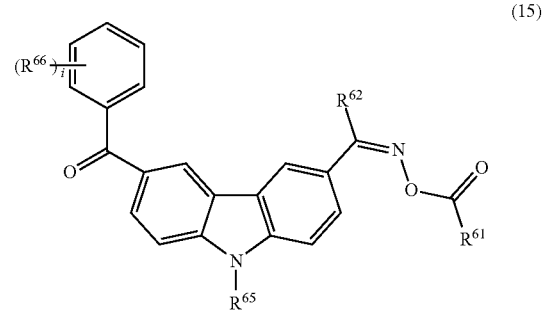

(15)

In the formula (15), $R^{61}$ is an alkyl group including 1 to 12 carbon atoms, an alkoxy group including 1 to 12 carbon atoms, or a cycloalkyl group including 4 to 10 carbon atoms; $R^{62}$ is an alkyl group including 1 to 12 carbon atoms, a cycloalkyl group including 4 to 10 carbon atoms, a phenyl group, or a tolyl group; $R^{65}$ is an alkyl group including 1 to 6 carbon atoms; $R^{66}$ is an alkyl group including 1 to 12 carbon atoms, or an organic, group having an acetal bond; and i is an integer of 0 to 5.

The component (B) and the other photopolymerization initiator other than the compound represented by the formula (11) may be substantially only a compound represented by the formula (11), or substantially only a compound represented by the formula (11) and a compound represented by the formula (15), and may be only a compound represented by the formula (11), or only a compound represented by the formula (11) and a compound represented by the formula (15).

In addition, 10% by mass or more, 20% by mass or more, 30% by mass or more, 40% by mass or more, 50% by mass or more, 60% by mass or more, 70% by mass or more, 80% by mass or more, 90% by mass or more, 95% by mass or more, 98% by mass or more, 99% by mass or more, or 100% by mass of the compound (B) and the other photopolymerization initiator other than the compound represented by the formula (11) may be a compound represented by the formula (11), or a compound represented by the formula (11) and a compound represented by the formula (15).

The content of the component (B) (or the sum of the content of the component (B) and the content of the other photopolymerization initiator other than the compound represented by the formula (11)) is preferably 0.1 to 20 parts by mass, more preferably 0.1 to 10 parts by mass, and still more preferably 0.1 to 5 parts by mass, based on 100 parts by mass of the component (A). Further, the content of the component (B) may be 0.1 parts by mass or more, 0.5 parts by mass or more, 0.7 parts by mass or more, 1.0 parts by mass or more, 1.2 parts by mass or more, or 1.5 parts by mass or more based on 100 parts by mass of the component (A). Such a content may further improve storage stability.

(Component (C): A Thermal Radical Generator)

The photosensitive resin composition of the invention contains (C) a thermal radical generator.

As the component (C), an organic peroxide is preferred.

Examples of the organic peroxide include dialkyl peroxide, ketone peroxide, peroxyketal, hydroperoxide, diacyl peroxide, peroxydicarbonate, and peroxyester, and dialkyl peroxide is preferred.

The dialkyl peroxide is a compound represented by the following general formula.

R—O—O—R'

In the formula, R and R' are independently a substituted or unsubstituted alkyl group. Examples of the substituent include an aryl group including 6 to 10 carbon atoms and the like. The number of carbon atoms of the alkyl group is, for example, 1 to 20 or 1 to 10.

Specific examples of the dalkyl peroxide include dicumyl peroxide (bis(1-phenyl-1-methylethyl)peroxide), di-t-butyl peroxide, di(2-t-butyl peroxyisopropyl)benzene, 2,5-dimethyl-2,5-di(t-butyl peroxy)hexane, t-butylcumyl peroxide, di-t-hexyl peroxide, 2,5-dimethyl-2,5-di(t-butyl peroxy)hexyne-3, and the like.

Examples of the commercially available product include trade names "PERCUMYL D", "PERBUTYL P", "PERHEXA 25B" "PERHEXYL C" "PERHEXYL D", "PERBUTYL D" "PERHEXYNE 256", "PERHEXYNE 256-40" (the above are manufactured by NOF CORPORATION), and the like.

The organic peroxide is preferably a compound having one-hour half-life temperature of 50° C. or more and 200° C. or less, and more preferably a compound having one-hour half-life temperature of 50° C. or more and 175° C. or less from the viewpoint of promoting a polymerization reaction at a lower temperature.

The one-hour half-life temperature is measured as follows.

An organic peroxide is dissolved in benzene to prepare a solution of 0.1 mol/L, and the solution was sealed in a glass tube subjected to nitrogen substitution. The tube is immersed in a thermostatic bath set at a predetermined temperature for thermal decomposition, and the relation between time (t) and ln a/(a−x) is plotted to obtained k from the slope of the obtained line, and the half-life ($t_{1/2}$) is obtained from the following formula.

$dx/dt = k(a-x)$ $\ln a/(a-x) = kt$ $x = a/2$ $kt_{1/2} = \ln 2$ x: amount of decomposed organic peroxide
k: decomposition rate constant
t: time
a: initial concentration of organic peroxide Since k is expressed by the following the formula, k is measured for several temperatures, and the activation energy ΔE is obtained from the slope of the line obtained by plotting the relationship between ln k and 1/T, and the frequency factor A is obtained from the y-intercept.

$k = A \exp[-\Delta E/RT]$ $\ln k = \ln A - \Delta E/RT$

A: frequency factor (1/h)
ΔE: activation energy (J/mol)
R: gas constant (8.314 J/mol·K)
T: absolute temperature (K)

From the line obtained by plotting the relation between ln $t_{1/2}$ and 1/T instead of lnk, the half-life of organic peroxide at any temperature is obtained, and the decomposition temperature obtaining an arbitrary half-life (1 h) is obtained.

The content of the component (C) is preferably 0.1 to 20 parts by mass, more preferably 0.2 to 20 parts by mass, and still more preferably 0.3 to 10 parts by mass, based 100 parts by mass of the component (A).

(Component (D): A Solvent Containing γ-Butyrolactone)

The photosensitive resin composition of the invention contains γ-butyrolactone as solvent. The photosensitive resin composition of the invention may contain an other solvent than γ-butyrolactone.

Examples of the other solvent include the following compounds.

Esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, ε-caprolactone, δ-valerolactone, alkyl oxy acetate (e.g., methyl oxy acetate, ethyl oxy acetate, butyl oxy acetate (e.g., methyl methoxyacetate, ethyl methoxyacetate, butyl methoxyacetate, methyl ethoxyacetate, ethyl ethoxyacetate, etc.), 3-oxypropionate alkyl esters (e.g., methyl 3-oxypropionate, ethyl 3-oxypropionate (e.g., methyl 3-methoxypropionate, ethyl 3-methoxypropionate, methyl 3-ethoxypropionate, ethyl 3-ethoxypropionate)), 2-oxypropionate alkyl esters (e.g., methyl 2-oxypropionate, ethyl 2-oxypropionate, propyl 2-oxypropionate (e.g., methyl 2-methoxypropionate, ethyl 2-methoxypropionate, propyl 2-methoxypropionate, methyl 2-ethoxypropionate, ethyl 2-ethoxypropionate)), methyl 2-oxy-2-methylpropionate, ethyl 2-oxy-2-methylpropionate (e.g., methyl 2-methoxy-2-methylpropionate, ethyl 2-ethoxy-2-methylpropionate), methyl pyruvate, ethyl pyruvate, propyl pyruvate, methyl acetoacetate, ethyl acetoacetate, methyl 2-oxobutanoate, ethyl 2-oxobutanoate, and the like; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, and the like; ketones such as methyl ethyl ketone, cyclohexanone, cyclopentanone, 2-heptanone, 3-heptanone, and N-methyl-2-pyrrolidon, and the like; aromatic hydrocarbons such as toluene, xylene, anisole, limonene, and the like; sulfoxides such as dimethyl sulfoxide, and the like; organic solvents such as 3-butoxy-N,N-dimethylpropanamide, 3-methoxy-N,N-dimethylpropanamide, N,N-dimethylacetamide, and the like can be given.

A solvent (component (D)) used in the photosensitive resin composition of the invention may be substantially only a γ-butyrolactone or may be only a γ-butyrolactone.

In addition, 10% by mass or more, 20% by mass or more, 30% by mass or more, 40% by mass or more, 50% by mass or more, 60% by mass or more, 70% by mass or more, 80% by mass or more, 90% by mass or more, 95% by mass or more, 98% by mass or more, 99% by mass or more, or 100% by mass of the solvent (component (D)) used in the photosensitive resin composition of the invention may be a γ-butyrolactone.

The content of the solvent (component (D)) in the photosensitive resin composition is not particularly limited, and is generally 50 to 1000 parts by mass based on 100 parts by mass of the component (A).

(Other Component)

In addition to the above components, the photosensitive resin composition of the invention may contain a thermal base generator, a polymerizable monomer, a coupling agent, a surfactant, a leveling agent, a rust inhibitor, a polymerization inhibitor, a sensitizer, or the like.

(Polymerizable Monomer)

Examples of the polymerizable monomer include diethyleneglycol di(metha)acrylate, triethyleneglycol di(metha)acrylate, tetraethyleneglycol di(metha)acrylate, tri methylol propanedi(metha)acrylate, trimethylol propanetri(metha)acrylate, 1,4-butanediol di(metha)acrylate, 1,6-hexanediol di(metha)acrylate, pentaerythritol tri(metha)acrylate, pentaerythritol tetra(metha)acrylate, ethoxylated pentaerythritol tetra(metha)acrylate, styrene, divinylbenzene, 4-vinyltoluene, 4-vinylpyridine, N-vinylpyrrolidone, 2-hydroxyethyl (metha)acrylate, 1,3-(meta)acryloyloxy-2-hydroxypropane, methylenebisacrylamide, N,N-dimethylacrylamide, N-methylolacrylamide, and the like.

Among these, from the viewpoint of mechanical properties and chemical resistance after curing, it is particularly preferred to be a polyfunctional polymerizable monomer having two or more functional groups (for example, (meth)acrylic groups).

When a polymerizable monomer is contained, the content of the polymerizable monomer is preferably 1 to 100 parts by mass, more preferably 1 to 75 parts by mass, and still more preferably 1 to 50 parts by mass, based on 100 parts by mass of the component (A).

(Coupling Agent)

Normally, the coupling agent reacts with the component (A) to crosslink in the heat treatment after development, or the coupling agent itself polymerizes in the heat treatment step. As a result, it is possible to further increase the adhesiveness between the obtained cured film and the substrate.

As the coupling agent, a silane coupling agent is preferred.

Examples thereof include ureidomethyltrimethoxysilane, ureidomethyltriethoxysilane, 2-ureidoethyltrimethoxysilane, 2-ureidoethyltriethoxysilane, 3-ureidopropyltrimethoxysilane, 3-ureidopropyltriethoxysilane, 4-ureidobutyltrimethoxysilane, 4-ureidobutyltriethoxysilane, and the like, 3-ureidopropyltriethoxysilane is preferable.

Further, a silane coupling agent having a hydroxy group or a glycidyl group may be used, and examples thereof include methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, isobutylmethylphenylsilanol, butylmethylphenylsilanol, ethyl-n-propylphenylsilanol, ethylisopropylphenylsilanol, n-butylethylphenylsilanol, isobutylethylphenylsilanol, tert-butylethylphenylsilanol, rnethyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, 1,4-bis(dibuthythydroxysilyl)benzene, and compound represented by the following formula (42). Among these, the compound represented by the formula (42) is particularly preferable in order to further improve the adhesiveness to the substrate.

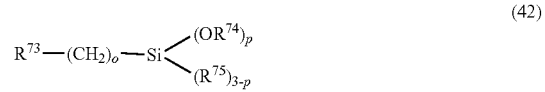

(42)

In the formula (42), $R^{73}$ is a monovalent organic group having a hydroxyl group or a glycidyl group, and $R^{74}$ and $R^{76}$ are independently an alkyl group including 1 to 5 carbon atoms; o is an integer of 1 to 10, and p is an integer of 1 to 3.

Examples of the compound represented by the formula (42) include hydroxymethyltrimethoxysilane, hydroxymethyltriethoxysilane, 2-hydroxyethyltrimethoxysilane, 2-hydroxyethyltriethoxysilane, 3-hydroxypropyltrimethoxysilane, 3-hydroxypropyltriethoxysilane, 4-hydroxybutyltrimethoxysilane, 4-hydroxybutyltriethoxysilane, glycidoxymethyltrimethoxysilane, glycidoxymethyltriethoxysilane, 2-glycidoxyethyltrimethoxysilane, 2-glycidoxyethyltriethoxysilane. 3-glycidoxypropyltrimethoxysilane, 3-glycidoxypropyltriethoxysilane, 4-glycidoxybutyltrimethoxysilane, 4-glycidoxybutyltriethoxysilane, and the like.

Further, a silane coupling agent further having an amino group may be used, and examples thereof include bis(2-hydroxymethyl)-3-aminopropyltriethoxysilane, bis(2-hydroxymethyl)-3-aminopropyltrimethoxysilane, bis(2-glycidoxymethyl)-3-aminopropyltriethoxysilane, bis(2-hydroxymethyl)-3-aminopropyltrimethoxysilane, and the like.

Further, a silane coupling agent further having an amide bond may be used, and examples thereof include a compound represented by the following formula (43).

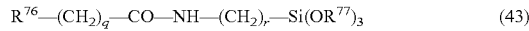

(43)

In the formula (43), $R^{76}$ is a proxy group or a glysidil group, q and r are independently an integer of 1 to 3, and $R^{77}$ is a methyl group, an ethyl group, or a propyl group.

When a silane coupling agent is used, the content of the silane coupling agent is preferably 0.1 to 20 parts by mass, more preferably 1 to 10 parts by mass, and still more preferably 0.3 to 10 parts by mass, based on 100 parts by mass of the component (A).

(Surfactant or Leveling Agent)

By containing a surfactant or a leveling agent, applicability (for example, suppression of striation (unevenness in film thickness)) and developability can be increased.

Examples of the surfactant or the leveling agent include, for example, polyoxyethylene urallyl ether, polyoxyethylene stearyl ether, polyoxyethylene oleyl ether, and polyoxyethylene octylphenol ether, and examples of commercially available products include the trade names "Megaface F171," "F173," "R-08" (manufactured by DIC Corporation), "Florard FC430," "FC431" (manufactured by 3M Japan Limited), and "organosiloxane polymer KP341," "KBM303," "KBM403," and "KBM803" (manufactured by Shin-Etsu Chemical Co., Ltd.).

When the surfactant or the leveling agent is contained, the content of the surfactant or the leveling agent is preferably 0.01 to 10 parts by mass, more preferably 0.05 to 5 parts by mass, and still more preferably 0.05 to 3 parts by mass with respect to 100 parts by mass of the component (A).

(Rust Inhibitor)

By comprising the rust inhibitor, corrosion of copper and copper alloy can be suppressed and discoloration of copper and copper alloy can be prevented. Examples of the rust inhibitor include triazole derivatives, tetrazole derivatives and the like.

When the rust inhibitor is used, the content of the rust inhibitor is preferably 0.01 to 10 parts by mass, more preferably 0.1 to 5 parts by mass, and more preferably 0.5 to 3 parts by mass with respect to 100 parts by mass of the component (A).

(Polymerization Inhibitor)

By comprising the polymerization inhibitor, good storage stability can be ensured.

Examples of the polymerization inhibitor include a radical polymerization inhibitor, a radical polymerization depressant, and the like.

Examples of the polymerization inhibitor include p-methoxyphenol, diphenyl-p-benzoquinone, benzoquinone, hydroquinone, pyrogallol, phenothiazine, resorcinol, orthodinitrobenzene, pallazinitrobenzene, methadinitrobenzene, phenanthraquinone, N-phenyl-2-naphthylamine, cuperone, 2,5-toluquinone, tannic acid, parabendylaminophenol, nitrosamines, and the like.

When the polymerization inhibitor is comprised, the content of the polymerization inhibitor is preferably 0.01 to 30 parts by mass, more preferably 0.01 to 10 parts by mass, and still more preferably 0.05 to 5 parts by mass with respect to 100 parts by mass of the component (A) from the viewpoint of storage stability of the photosensitive resin composition and heat resistance of the cured film obtained.

(Sensitizer)

Examples of the sensitizer include, for example, 7-N,N-diethylaminocumarine, 7-diethylamino-3-tenonylcoumarin, 3,3'-carbonylbis(7-N,N-diethylamino)coumarin, 3,3'-carbonylbis(7-N,N-dimethoxy)coumarin, 3-thienylcarbonyl-7-N,N-diethylaminocumarine, 3-benzoylcoumarin, 3-benzoyl-7-N,N-methoxycoumarin, 3-(4'-methoxybenzoyl)coumarin, 3-3'-carbonylbis-5,7-(dimethoxy)coumarin, benzalacetophenone, 4'-N,N-dimethylaminobenzalacetophenone, 4'-acetoaminobenzal-4-methoxyacetophenone, diethylaminobenzophenone, 4,4'-bis(N-ethyl, N-methyl)benzophenone, 4,4'-bis-(diethylamino)benzophenone, and the like.

When the sensitizer is contained, the amount is more preferably 0.1 to 3.0 parts by mass, more preferably 0.1 to 1.0 parts by mass, based on 100 parts by mass of (a) polyimide precursor.

The photosensitive resin composition of the invention is essentially composed of components (A) to (D), and one or more components selected from the group consisting of a thermal base generator, a crosslinking agent (polymerizable monomer), a coupling agent, a surfactant or a leveling agent, a rust inhibitor, a polymerization inhibitor, and a sensitizer, and may contain other unavoidable impurities within a range not impairing the effect of the invention.

For example, 80% by mass or more, 90% by mass or more, 95% by mass or more, 98% by mass or more, 99% by mass or more, 99.5% by mass or more, 99.9% by mass or more, or 100% by mass of the photosensitive resin composition of the invention may be composed of
- components (A) to (D), or
- components (A) to (D), and one or more components selected from the group consisting of a thermal base generator, a crosslinking agent (polymerizable monomer), a coupling agent, a surfactant or a leveling agent, a rust inhibitor, a polymerization inhibitor, and a sensitizer.

[Cured Film]

A cured film of the invention can be obtained by curing the above-described photosensitive resin composition. The cured film of the invention may be used as a pattern cured film or as a pattern-less cured film. The thickness of the cured film of the invention is preferably 5 to 20 μm.

[Method for Manufacturing Pattern Cured Film]

The method for manufacturing a pattern cured film of the invention contains a step of coating the above-described photosensitive resin composition on a substrate and drying to form a photosensitive resin film, a step of pattern-exposing the photosensitive resin film to obtain a resin film, a step of developing the resin film after the pattern exposure using an organic solvent to obtain a pattern resin film, and a step of heat-treating the pattern resin film. Thus, a pattern cured film can be obtained.

A method for manufacturing a pattern-less cured film contains, for example, the above-described steps of forming a photosensitive resin film and a step of heat-treating. Further, a step of exposing may be contained.

Examples of the substrate include a glass substrate, a semiconductor substrate such as a Si substrate (silicon wafer), a $TiO_2$ substrate, a metal-oxide-insulator substrate such as a $SiO_2$ substrate, a silicon nitride substrate, a copper substrate, a copper-alloy substrate, and the like.

The application method is not particularly limited, and can be performed using a spinner or the like.

The drying can be performed using a hot plate, an oven, or the like.

The drying temperature is preferably 90 to 150° C., more preferably 90 to 120° C.

The drying time is preferably 30 seconds to 5 minutes.

The drying may be performed two or more times.

As a result, a photosensitive resin film in which the photosensitive resin composition described above is formed in a film shape can be obtained.

The thickness of the photosensitive resin film is preferably 5 to 100 μm, more preferably 8 to 50 μm, and still more preferably 10 to 30 μm.

In the pattern exposure, for example, a predetermined pattern is exposed through a photomask.

Examples of the active light to be irradiated include ultraviolet rays such as i-ray, visible ray, radiant ray, and the like, and i-ray is preferable.

As the exposure apparatus, a parallel exposure machine, a projection exposure machine, a stepper, a scanner exposure machine, or the like can be used.

As a result of development, a pattern resin film can be obtained. Generally, when a negative photosensitive resin composition is used, unexposed portions are removed with a developer.

As an organic solvent used as the developer, a good solvent for the photosensitive resin film can be used alone, or a good solvent and a poor solvent for the photosensitive resin film can be used in combination appropriately.

Examples of the good solvent include N-methylpyrrolidone, N-acetyl-2-pyrrolidone, N,N-dimethylacetamide, N,N-dimethylformamide, dimethylsulfoxide, gammabutyrolactone, α-acetyl-gammabutyrolactone, cyclopentanone, cyclohexanone, and the like.

Examples of the poor solvent include toluene, xylene, methanol, ethanol, isopropanol, propylene glycol monomethyl ether acetate, propylene glycol monomethyl ether, water, and the like.

A surfactant may be added to the developer. The additive amount is preferably 0.01 to 10 parts by mass and more preferably 0.1 to 5 parts by mass with respect to 100 parts by mass of the developer.

The development time can be, for example, twice as long as the time until the photosensitive resin film is dissolved in the developer from when immersed therein.

The development time varies depending on the component (A) used, but is preferably from 10 seconds to 15 minutes, more preferably from 10 seconds to 5 minutes, and more preferably from 20 seconds to 5 minutes from the viewpoint of productivity.

After development, washing may be performed with a rinse solution.

As the rinse solution, distilled water, methanol, ethanol, isopropanol, toluene, xylene, propylene glycol monomethyl ether acetate, propylene glycol monomethyl ether, or the like may be used alone or as a mix as appropriate, or may be used in a stepwise combination.

A pattern cured film can be obtained by heat-treating the pattern resin film.

The polyimide precursor of the component (A) may undergo a dehydration ring-closing reaction by a heat treatment step to be the corresponding polyimide.

The temperature of the heat treatment is preferably 250° C. or lower, more preferably 120 to 250° C., and still more preferably 200° C. or lower or 150 to 200° C.

Within the above range, damage to the substrate and the device can be suppressed to a small level, the device can be produced with a high yield, and energy saving of the process can be realized.

The time of the heat treatment is preferably 5 hours or less, more preferably 30 minutes to 3 hours. Within the above range, the crosslinking reaction or the dehydration ring closure reaction can sufficiently proceed.

The atmosphere of the heat treatment may be an air atmosphere or an inert atmosphere such as nitrogen, but from the viewpoint of preventing oxidation of the pattern resin film, the atmosphere is preferably a nitrogen atmosphere.

Examples of the device used for the heat treatment include a quartz tube oven, a hotplate, a rapid thermal annealing, a vertical diffusion furnace oven, an infrared curing oven, an electron beam curing oven, and a microwave curing oven.

[Interlayer Insulating Film, Cover Coating Layer; Surface Protective Film, Electronic Component]

The cured film of the invention can be used as a passivation film, a buffer coat film, an interlayer insulating film, a cover coat layer, a surface protective film, or the like.

With the use of one or more selected from the group consisting of the passivation film, the buffer coat film, the interlayer insulating film, the cover coat layer, the surface protective film, and the like, highly reliable electronic components such as semiconductor devices, multilayer wiring boards, and various electronic devices can be produced.

An example of a manufacturing process of a semiconductor apparatus which is an electronic component of the invention will be described with reference to the drawings.

The FIGURE is a manufacturing process diagram of a semiconductor apparatus having a multilayer wiring structure which is an electronic component according to an embodiment of the invention.

In the FIGURE, a semiconductor substrate 1 such as a Si substrate having a circuit device is covered with a protective film 2 such as a silicon oxide film except a predetermined portion of the circuit device, and a first conductor layer 3 is formed on the exposed circuit device. Thereafter, an interlayer insulating film 4 is formed on the semiconductor substrate 1.

Next, a photosensitive resin layer 5 such as a chlorinated rubber-based resin, a phenolic novolac-based resin, or the like is formed on the interlayer insulating film 4, and a window 6A is provided so that a predetermined portion of the interlayer insulating film 4 is exposed by a known photolithography technique.

The interlayer insulating film 4 in which the window 6A is exposed is selectively etched to provide a window 6B.

Next, the photosensitive resin layer 5 is removed by using an etchant that etches the photosensitive resin layer 5 without corroding the first conductor layer 3 exposed from the window 6B.

Further, the second conductor layer 7 is formed and electrically connected to the first conductor layer 3 by using a known photolithography technique.

In the case of forming a multilayer wiring structure of three or more layers, each layer can be formed by repeating the above steps.

Next, by using the above-mentioned photosensitive resin composition, the window 6C is opened by pattern exposure, and a surface protective film 8 is formed. The surface protective film 8 protects the second conductive layer 7 from external stress, α rays, and the like, and the resulting semiconductor device is excellent in reliability.

In the above example, it is also possible to form an interlayer insulating film using the photosensitive resin composition of the invention.

EXAMPLES

Hereinafter, the invention will be described in detail based on Examples and Comparative Examples. Note that the invention is not limited to the following Examples.

Synthesis Example 1 (Synthesis of Polymer A1)

7.07 g of 3,3',4,4'-diphenylether tetracarboxylic dianhydride (ODPA), 0.831 g of 2-hydroxyethyl methacrylate (HEMA), and a catalytic amount of 1,4-diazabicyclo[2.2.2] octane were dissolved in 30 g of N-methyl-2-pyrrolidone (NMP) and stirred at 45° C. for 1 hours and then the mixture was cooled to 25° C. A solution of 4.12 g of 2,2'-dimethylbiphenyl-4,4'-diamine (DMAP) dissolved in NMP was added to the mixture and then stirred at 30° C. for 4 hours. Thereafter, the mixture was stirred at room temperature overnight to obtain a reaction solution.

To this reaction solution, 9.45 g of trifluoroacetic anhydride was added, and the mixture was stirred at 45° C. for 3 hours, and 7.08 g of HEMA and 0.01 g of benzoquinone were added to thereto and stirred at 45° C. for 20 hours. The reaction solution was added dropwise to distilled water, and the precipitate was collected by filtration and dried under reduced pressure to obtain a polyimide precursor A1.

The weight-average molecular weight was determined by standard polystyrene conversion using the gel permeation chromatography (GPC) method under the following conditions. The weight-average molecular weight of A1 was 25,575.

A solution of 0.5 mg of A1 in 1 mL of solvent [tetrahydrofuran (THF)/dimethylformamide (DMF)=1/1 (volume ratio)] was used to measure.

Measuring instrument: Detector L4000UV manufactured by Hitachi, Ltd.

Pumps: L6000 manufactured by Hitachi, Ltd.

C-R4A Chromatopac manufactured by Shimadzu Corporation

Measuring conditions: two columns of Gelpack GL-S300MDT-5

Eluent: THF/DMF=1/1 (volume ratio)

LiBr (0.03 mol/L), $H_3PO_4$ (0.06 mol/L)

Flow rate: 1.0 mL/min

Detector: UV 270 nm

The esterification ratio of A1 (the ratio of reaction with the HEMA of the carboxylic group of ODPA) was calculated by NMR-measurement under the following condition. The esterification ratio was 80 mol % based on the total carboxy group and the total carboxy ester (the remaining 20 mol % was a carboxy group).

Measurement instrument: AV400M manufactured by Bruker Japan K.K.

Magnetic field strength: 400 MHz

Reference substance: tetramethylsilane (TMS)

Solvent: dimethylsulfoxide (DMSO)

Each of the components used in the following Examples and Comparative Examples is as follows.

(Component (A): A Polyimide Precursor Having a Polymerizable Unsaturated Bond)

A1: Polymer A1 Obtained in Synthesis Example 1

(Component (8): A Photopolymerization Initiator)

"IRUGCURE OXE 01" (I-OXE-01, manufactured by BASF Japan Ltd., trade name, a compound represented by the following formula)

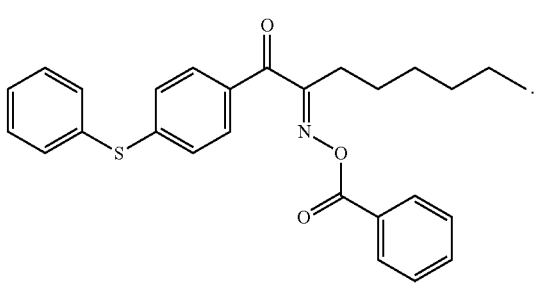 [SMILES: CCCCCC/C(=N\OC(=O)c1ccccc1)C(=O)c1ccc(Sc2ccccc2)cc1]

"TR-PBG-305" (manufactured by Changzhou Tronly New Electronic Materials Co., Ltd., trade name, a compound represented by the following formula)

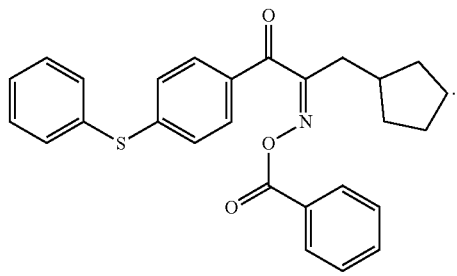 [SMILES: O=C(O/N=C(/CC1CCCC1)C(=O)c1ccc(Sc2ccccc2)cc1)c1ccccc1]

"TR-PBG-371" (manufactured by Changzhou Tronly New Electronic Materials Co., Ltd., trade name, 3-cyclohexyl-1-(6-(2-(benzoyloxyimino)octanoyl)-9-ethyl-carbazol-3-yl)-propane-1,2-dione-2-(O-benzoyloxime))

(Component))(B°

"IRGACURE OXE 02" (I-OXE-02, manufactured by BASF Japan Ltd., trade name, a compound represented by the following formula)

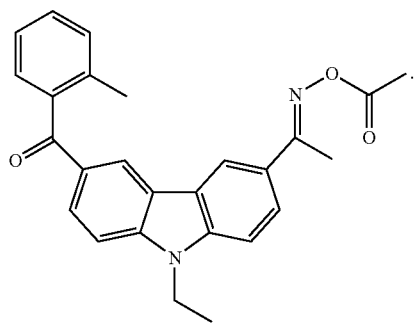 [SMILES: CCn1c2ccc(C(=O)c3ccccc3C)cc2c2cc(/C(C)=N/OC(C)=O)ccc21]

"TR-PBG-3057" (manufactured by Changzhou Tronly New Electronic Materials Co, Ltd., trade name, a compound represented by the following formula)

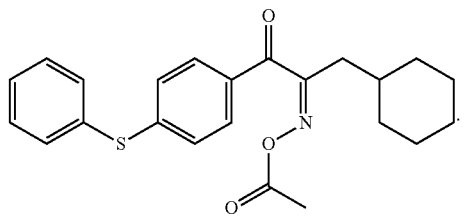 [SMILES: CC(=O)O/N=C(/CC1CCCCC1)C(=O)c1ccc(Sc2ccccc2)cc1]

"NCI-930" (manufactured by ADEKA Corporation, trade name, a compound represented by the following formula)

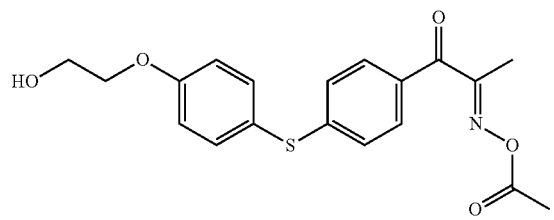 [SMILES: CC(=O)O/N=C(\C)C(=O)c1ccc(Sc2ccc(OCCO)cc2)cc1]

Note that the component (B') means a component different from the component (B) referred to in the invention.

(Component (C): A Thermal Radical Generator)
C1: "PERCUMYL D" (manufactured by NOF CORPORATION, dicumyl peroxide, a compound represented by the following formula, one-hour half-life temperature: 135.7° C.)

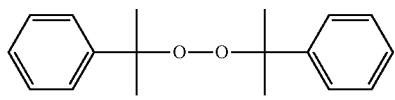 [SMILES: CC(C)(OOC(C)(C)c1ccccc1)c1ccccc1]

(Component (D): A Solvent)
D1: γ-butyrolactone (GBL)
(Other Component: A Polymerizable Polymer)
"A-DCP" (manufactured by Shin-Nakamura Chemical Co., Ltd., tricyclodecanedimethanol diacrylate, a compound represented by the following formula)

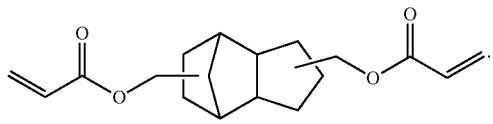

"ATM-4E" (manufactured by Shin-Nakamura Chemical Co., Ltd., ethoxylated pentaerythritol tetraacrylate, a compound represented by the following formula)

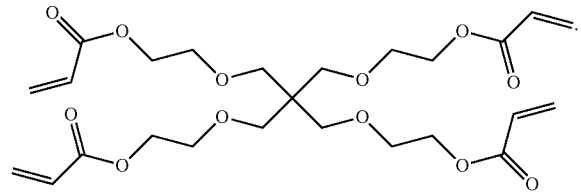 [SMILES: C=CC(=O)OCCOCC(COCCOC(=O)C=C)(COCCOC(=O)C=C)COCCOC(=O)C=C]

"TEGDMA" (manufactured by SARTOMER, a compound represented by the following formula)

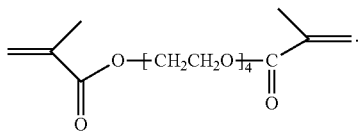

"ATM-35E" (manufactured by Shin-Nakamura Chemical Co., Ltd., a compound represented by the following formula)

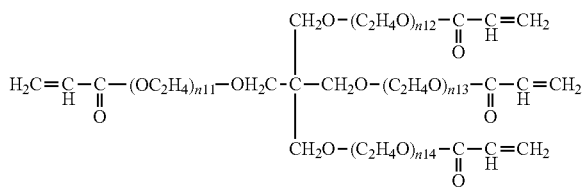

($n11+n12+n13+n14=35$)

Examples 1 to 5 and Comparative Examples 1 to 3

[Preparation of a Photosensitive Resin Composition]
A photosensitive resin composition was prepared with the components and the blending amount shown in Table 1. The blending amount of Table 1 is indicated in parts by mass of each component based on 100 parts by mass of the component (A).

[Manufacturing and Evaluation of a Pattern Resin Film]
(Manufacturing of a Pattern Resin Film)
The obtained photosensitive resin composition (stored for 0 weeks) was spin-coated on a silicon wafer using a coating device "Act8" (manufactured by Tokyo Electron Limited), dried at 100° C. for 2 minutes, and then dried at 110° C. for 2 minutes to form a photosensitive resin film having a dry film thickness of 13 μm. The development time was set to twice the time required to completely dissolve the obtained photosensitive resin film by immersion in cyclopentanone.

In addition, a photosensitive resin film was produced in the same manner as described above, and the obtained photosensitive resin film was exposed by irradiating predetermined patterns with i-line of 100 to 600 mJ/cm$^2$ at 50 mJ/cm$^2$ increment using an i-ray stepper FPA-3000iW (manufactured by Canon Inc.). The resin film after the exposure was paddle-developed in cyclopentanone using "Act8" for the above development time, and then rinsed with propylene glycol monomethyl ether acetate (PGMEA) to obtain a patterned resin film.

The above operation was also performed on each of the photosensitive resin composition after storage at room temperature for 1 weeks and the photosensitive resin composition after storage at room temperature for 2 weeks to obtain a pattern resin film.

(Evaluation of Storage Stability: Change in Residual Film Ratio)
For each of the pattern resin film prepared using the photosensitive resin composition immediately after preparation (stored for 0 weeks), also referred to as "pattern resin film (stored for 0 weeks)," and the pattern resin film prepared using the photosensitive resin composition after storage for 2 weeks at room temperature, also referred to as "pattern resin film (stored for 2 weeks)," the film thickness of the obtained pattern resin film was divided by the film thickness of the photosensitive resin film before exposure to calculate the residual film ratio (%). As the change in the residual film ratio, (the residual film ratio (%) of the pattern resin film (stored for 0 weeks)-(residual film rate (%) of the pattern resin film (stored for 2 weeks)) was obtained. The smaller the change in residual film ratio, the better the storage stability. The storage stability was indicated as ○ when the change in the residual film ratio was less than 5%. The storage stability was indicated as Δ when the change in the residual film ratio was 5% or more and less than 10%, and the storage stability was indicated as x when the change in the residual film ratio was 10% or more. The results are shown in Table 1.

The residual film ratio (%) was measured by varying the exposure dose (mJ/cm$^2$) for the photosensitive resin composition immediately after preparation (stored for 0 weeks), after storage for 1 week, and after storage for 2 weeks, and the dependency of the residual film ratio on the exposure dose was examined. It was found that the photosensitive resin compositions obtained in Examples 1 to 5 exhibited extremely small change in residual film ratio even when the exposure dose was changed, and exhibited high storage stability in a wide exposure dose.

TABLE 1

|  |  | Ex. 1 | Ex. 2 | Ex. 3 | Ex. 4 | Ex. 5 | Comp. Ex. 1 | Comp. Ex. 2 | Comp. Ex. 3 |
|---|---|---|---|---|---|---|---|---|---|
| Component (A) | Polymer A1 | 100 | 100 | 100 | 100 | 100 | 100 | 100 | 100 |
| Component (B) | I-OXE-01 | 1 | 1.5 | 2 | — | — | — | — | — |
|  | TR-PBG-305 | — | — | — | 1 | — | — | — | — |
|  | TR-PBG-371 | — | — | — | — | 1 | — | — | — |
| Component (B') | I-OXE-02 | — | — | — | — | — | 1 | — | — |
|  | TR-PBG-3057 | — | — | — | — | — | — | 1 | — |
|  | NCI-930 | — | — | — | — | — | — | — | 1 |
| Component (C) | PERCUMYL D | 2 | 2 | 2 | 2 | 2 | 2 | 2 | 2 |
| Component (D) | GBL | 160 | 160 | 160 | 160 | 160 | 160 | 160 | 160 |
| Other component | A-DCP | 10 | 10 | 10 | 10 | 10 | 10 | 10 | 10 |
|  | ATM-4E | 10 | 10 | 10 | 10 | 10 | 10 | 10 | 10 |
|  | TEGDMA | 10 | 10 | 10 | 10 | 10 | 10 | 10 | 10 |
|  | ATM-35E | 10 | 10 | 10 | 10 | 10 | 10 | 10 | 10 |
| Storage stability |  | ○ | ○ | ○ | ○ | ○ | X | X | Δ |

From Table 1, it can be seen that, in Examples 1 to 5, by using GBL instead of NMP and using a compound having a specific structure (component (B)) as a photopolymerization initiator, a resin composition having low toxicity and small change in residual film ratio after storage for a long period of time, that is, excellent in storage stability, was obtained. The storage stability is comparable to that of conventional resin compositions using NMP as a solvent.

[Manufacturing of a Cured Product]

For Examples 1 to 5, the pattern resin film obtained in manufacturing of a pattern resin film was heated at 175° C. for 1 hour under a nitrogen atmosphere using a vertical diffusion furnace μ-TF (manufactured by Koyo Thermo Systems Co., Ltd.) to obtain a cured product (film thickness after curing: 7 to 10 μm).

In Examples 1 to 5, good cured products were obtained.

INDUSTRIAL APPLICABILITY

The photosensitive resin composition of the invention can be used for an interlayer insulating film, a cover coat layer, a surface protective film, or the like, and the interlayer insulating film, the cover coat layer, or the surface protective film of the invention can be used for an electronic component or the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification and the specification of Japanese application(s) on the basis of which the present application claims Paris convention priority are incorporated herein by reference in its entirety.

The invention claimed is:

1. A photosensitive resin composition comprising:
    (A) a polyimide precursor having a polymerizable unsaturated bond;
    (B) a photopolymerization initiator comprising a compound represented by the following formula (11);
    (C) a thermal radical generator;
    (D) a solvent containing γ-butyrolactone:

(11)

wherein in the formula (11), $R^{11}$ is a substituted or unsubstituted benzoyl group, a substituted or unsubstituted fluorenyl group, or a group comprising a substituted or unsubstituted carbazolyl group;

$R^{12}$ is an alkyl group including 1 to 12 carbon atoms, a group comprising a cycloalkyl group including 4 to 10 carbon atoms, a group comprising a phenyl group, or a group comprising a tolyl group;

$R^{13}$ is a substituted or unsubstituted aromatic hydrocarbon group including 6 to 20 carbon atoms;

tricyclodecanedimethanol diacrylate; and one or more polymerizable monomers selected from the group consisting of diethyleneglycol di(metha)acrylate, triethyleneglycol di(metha)acrylate, tetraethyleneglycol di(metha)acrylate, trimethylol propanedi(metha)acrylate, trimethylol propanetri(metha)acrylate, 1,4-butanediol di(metha)acrylate, 1,6-hexanediol di(metha)acrylate, pentaerythritol tri(metha)acrylate, pentaerythritol tetra(metha)acrylate, and ethoxylated pentaerythritol tetra(metha)acrylate.

2. The photosensitive resin composition according to claim 1, wherein the compound represented by the formula (11) is a compound represented by the following formula (12):

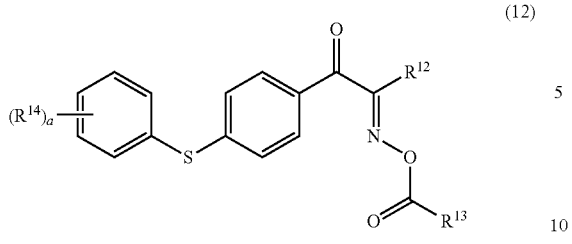

(12)

wherein in the formula (12), $R^{12}$ and $R^{13}$ are the same as in the formula (11); $R^{14}$ is a monovalent organic group; and a is an integer of 0 to 5.

3. The photosensitive resin composition according to claim 2, wherein a is 0.

4. The photosensitive resin composition according to claim 1, wherein $R^{13}$ is a substituted or unsubstituted phenyl group.

5. The photosensitive resin composition according to claim 1, wherein $R^{12}$ is an alkyl group including 1 to 12 carbon atoms, or a group comprising a cycloalkyl group including 4 to 10 carbon atoms.

6. The photosensitive resin composition according to claim 1, wherein the component (C) comprises a compound having a decomposition point of 110° C. or higher and 200° C. or lower.

7. The photosensitive resin composition according to claim 1, wherein the component (C) comprises bis(1-phenyl-1-methylethyl) peroxide.

8. The photosensitive resin composition according to claim 1, wherein the component (A) is a polyimide precursor having a structural unit represented by the following formula (1):

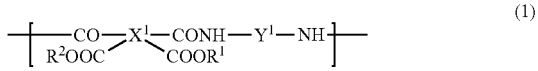

(1)

wherein in the formula (1), $X^1$ is a tetravalent aromatic group; $Y^1$ is a divalent aromatic group; $R^1$ and $R^2$ are independently a hydrogen atom, a group represented by the following formula (2), or an aliphatic hydrocarbon group including 1 to 4 carbon atoms; at least one of $R^1$ and $R^2$ is a group represented by the following formula (2); a —$COOR^1$ group and a —CONH— group are in ortho-position with each other; and a —$COOR^2$ group and a —CO-group are in ortho-position with each other;

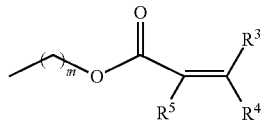

(2)

wherein in the formula (2), $R^3$ to $R^5$ are independently a hydrogen atom, or an aliphatic hydrocarbon group including 1 to 3 carbon atoms; and m is an integer of 1 to 10.

9. The photosensitive resin composition according to claim 1, wherein the one or more polymerizable monomers are one or more polymerizable monomers selected from the group consisting of triethyleneglycol di(metha)acrylate, tetraethyleneglycol di(metha)acrylate, and ethoxylated pentaerythritol tetra(metha)acrylate.

10. A method of manufacturing a pattern cured film comprising:
coating the photosensitive resin composition according to claim 1 on a substrate, followed by drying to form a photosensitive resin film;
pattern-exposing the photosensitive resin film to obtain a resin film;
developing the resin film after the pattern exposure using an organic solvent to obtain a pattern resin film; and
heat-treating the pattern resin film.

11. The method for manufacturing a pattern cured film according to claim 10, wherein a temperature of the heat treatment is 200° C. or lower.

12. A cured film obtained by curing the photosensitive resin composition according to claim 1.

13. The cured film according to claim 12, which is a pattern cured film.

14. An interlayer insulating film, a cover coat layer, or a surface protective film manufactured by using the cured film according to claim 12.

15. An electronic component comprising the interlayer insulating film, the cover coat layer, or the surface protective film according to claim 14.

\* \* \* \* \*